(12) United States Patent
Sutou

(10) Patent No.: US 8,539,415 B2
(45) Date of Patent: Sep. 17, 2013

(54) RECONFIGURABLE CIRCUIT, ITS DESIGN METHOD, AND DESIGN APPARATUS

(75) Inventor: Shinichi Sutou, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 454 days.

(21) Appl. No.: 12/635,347

(22) Filed: Dec. 10, 2009

(65) Prior Publication Data

US 2010/0169607 A1   Jul. 1, 2010

(30) Foreign Application Priority Data

Dec. 25, 2008   (JP) ................................ 2008-331046

(51) Int. Cl.
  *G06F 17/50*   (2006.01)
  *G06F 9/455*   (2006.01)
(52) U.S. Cl.
  USPC ........................... 716/117; 716/116; 716/132
(58) Field of Classification Search
  USPC ......................... 716/117, 116, 132
  See application file for complete search history.

(56) References Cited

U.S. PATENT DOCUMENTS

| | | | |
|---|---|---|---|
| 6,803,782 B2 * | 10/2004 | Koob et al. | 326/10 |
| 7,343,579 B2 * | 3/2008 | Coxe et al. | 716/101 |
| 7,698,594 B2 * | 4/2010 | Aizawa | 714/10 |
| 7,904,848 B2 * | 3/2011 | Coene et al. | 716/126 |
| 2004/0139413 A1 * | 7/2004 | DeHon et al. | 716/9 |
| 2005/0066152 A1 * | 3/2005 | Garey | 712/226 |
| 2007/0220522 A1 * | 9/2007 | Coene et al. | 718/104 |
| 2008/0034235 A1 | 2/2008 | Houshaku | |
| 2010/0017774 A1 | 1/2010 | Bachina et al. | |

FOREIGN PATENT DOCUMENTS

| | | |
|---|---|---|
| JP | 2001-084286 A | 3/2001 |
| JP | 2006-163815 A | 6/2006 |
| WO | 2008/026731 A1 | 3/2008 |

OTHER PUBLICATIONS

Japanese Office Action, Notification of Reasons for Refusal, dated Apr. 23, 2013, 9 pages.

\* cited by examiner

*Primary Examiner* — Thuan Do
*Assistant Examiner* — Magid Dimyan
(74) *Attorney, Agent, or Firm* — Arent Fox LLP

(57) ABSTRACT

A reconfigurable circuit design method includes an input step of inputting design data of a default configuration of a reconfigurable circuit including a plurality of processor elements which perform processing and a first generation step of generating design data obtained by modifying at least one of the processor elements in the reconfigurable circuit with the default configuration.

10 Claims, 15 Drawing Sheets

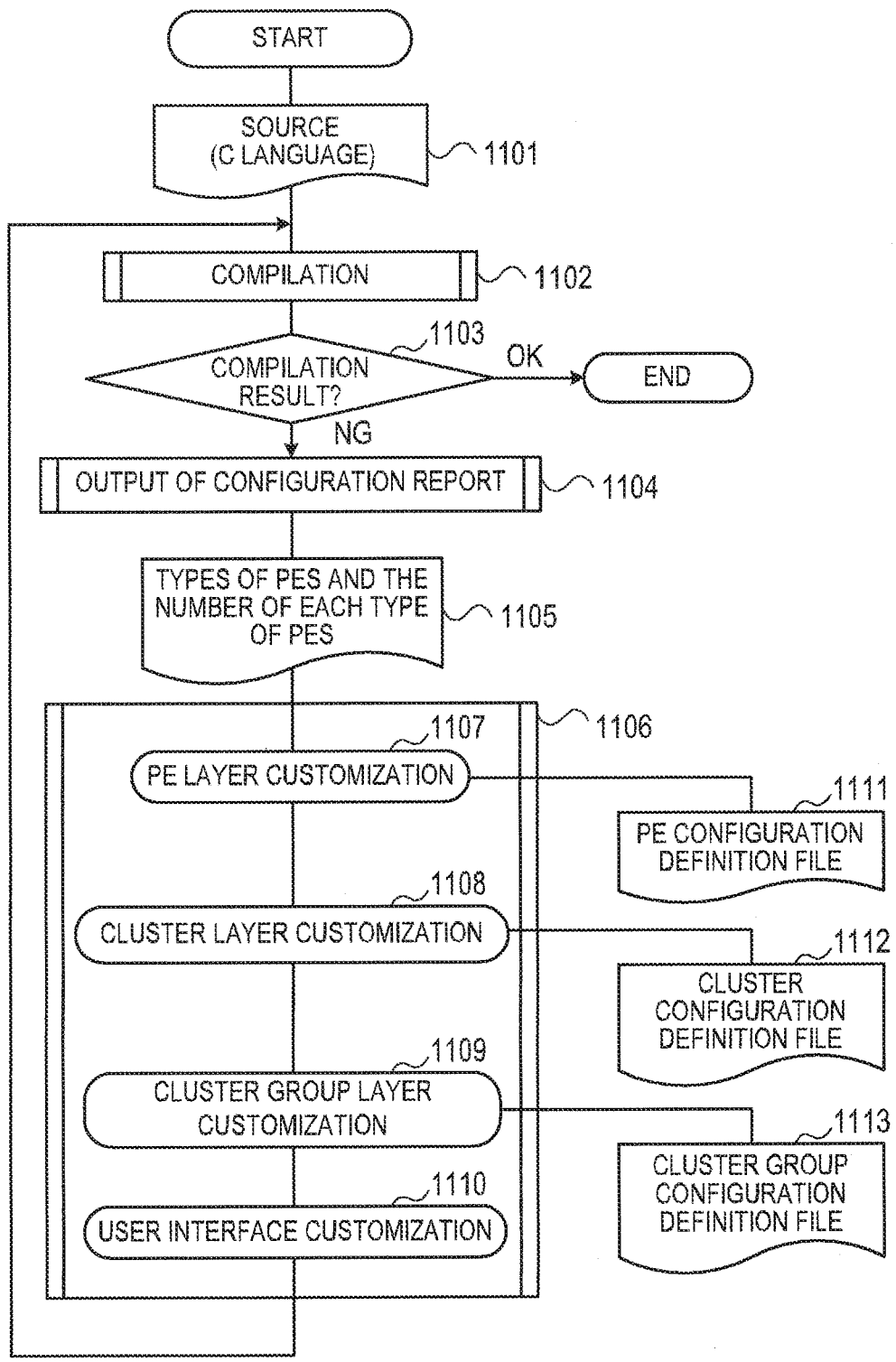

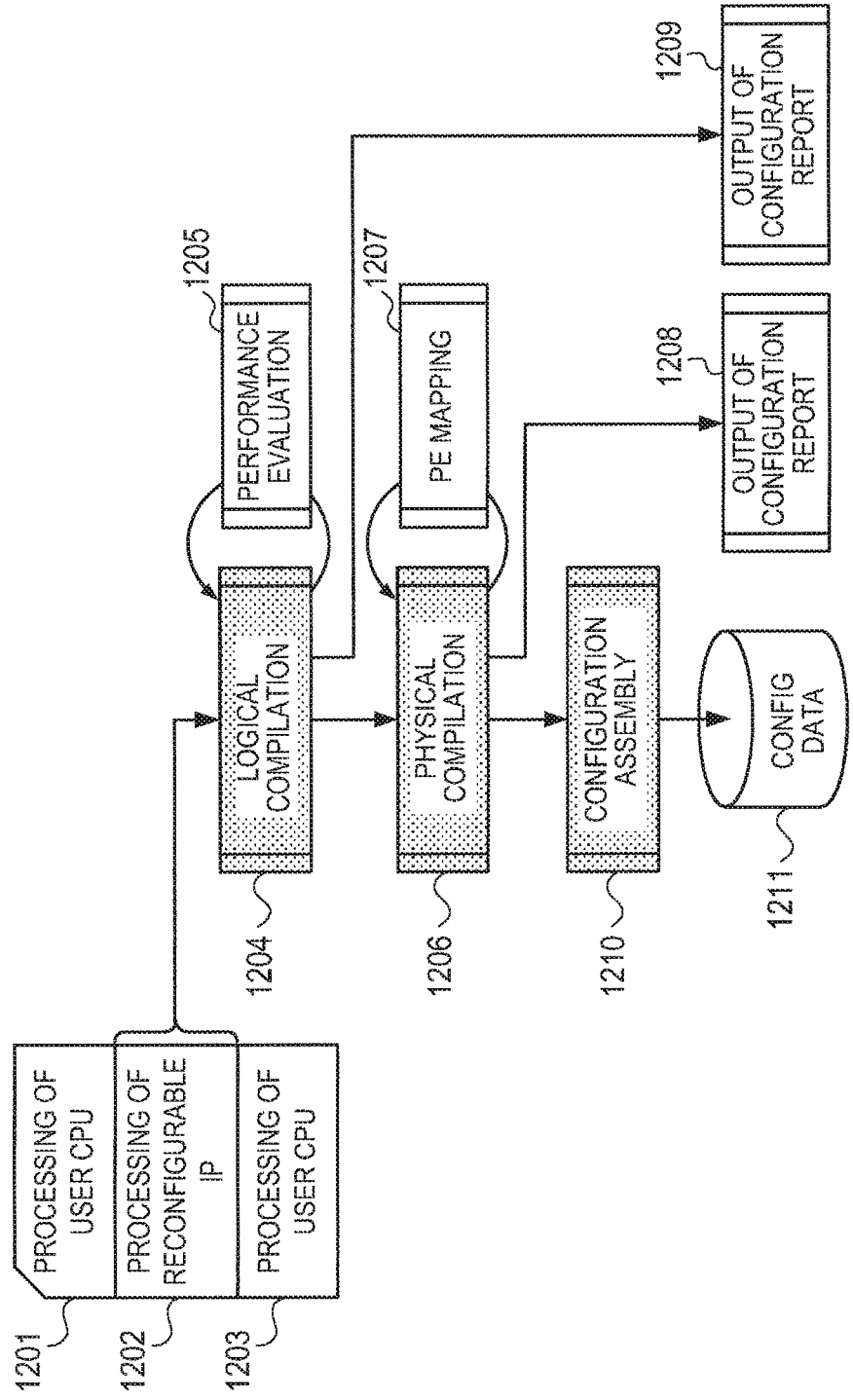

RECONFIGURABLE CIRCUIT, ITS DESIGN METHOD, AND DESIGN APPARATUS

CROSS-REFERENCE TO RELATED APPLICATIONS

This application is based upon and claims the benefit of priority from the prior Japanese Patent Application No. 2008-331046 filed on Dec. 25, 2008, the entire contents of which are incorporated herein by reference.

FIELD OF THE INVENTION

The present invention relates to a reconfigurable circuit, a design method, and a design apparatus for designing the reconfigurable circuit.

BACKGROUND

A reconfigurable circuit generally has a plurality of processor elements whose functions can be changed. The plurality of processor elements are generally arranged in a matrix and a selectively connectable network is provided among the plurality of processor elements.

Japanese Laid-Open Patent Publication No. 2006-163815 discloses a signal processor having a plurality of processor elements, each including a computing unit which performs arithmetic and logic operations, a bus which connects the plurality of processor elements, a switch section which changes connection of the bus, and a control circuit which controls the switch section in accordance with software.

SUMMARY

According to an aspect of the Applicant's invention, a reconfigurable circuit design method includes an input step of inputting design data of a default configuration of a reconfigurable circuit including a plurality of processor elements which perform processing and a first generation step of generating design data obtained by modifying at least one of the processor elements in the reconfigurable circuit with the default configuration.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 is a flow chart illustrating a processing example of a method for designing a reconfigurable circuit using the design apparatus in FIG. 10;

FIG. 12 is a flow chart illustrating the details of compilation in FIG. 11;

DESCRIPTION OF THE PREFERRED EMBODIMENTS

Figure 1:
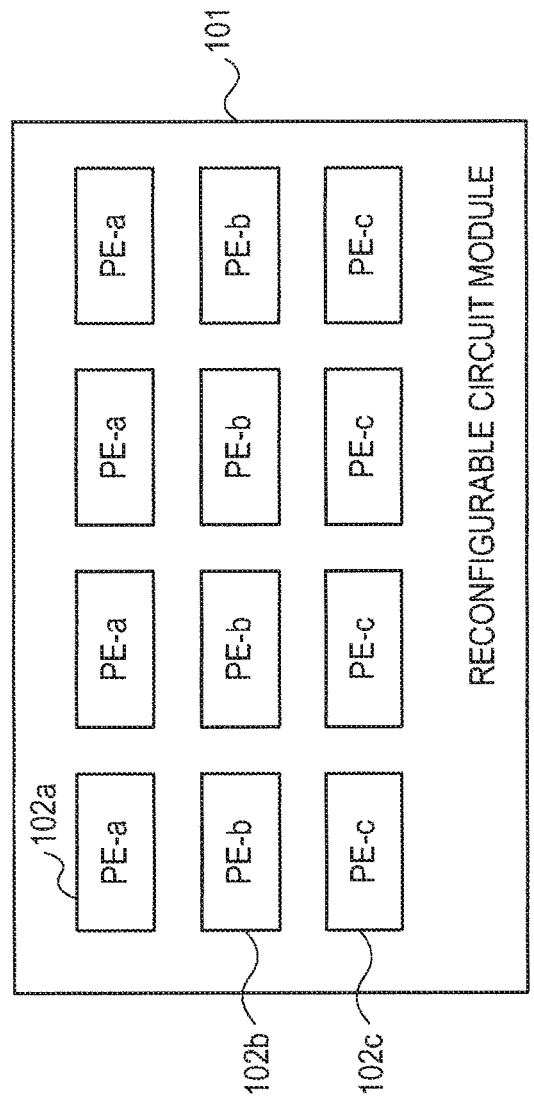
FIG. 1 is a diagram illustrating an example of the configuration of a reconfigurable circuit module with a default configuration according to an aspect of the Applicant's invention of the present invention.

FIG. 1 is a diagram illustrating an example configuration of a reconfigurable circuit module with a default configuration according to an aspect of the Applicant's invention of the present invention. A reconfigurable circuit module 101 has, for example, fourth first processor elements (PEs) 102a, four second processor elements 102b, and four third processor elements 102c. Hereinafter, the processor elements 102a, 102b, and 102c will each be referred to as a processor element 102 or will be generically referred to as processor elements 102. The processor element 102 performs an arithmetic operation, a logic operation, or the like. For example, the first processor element 102a performs addition/subtraction processing, and the second processor element 102b performs multiplication processing. The third processor element 102c is a counter which makes a count. The reconfigurable circuit module 101 has the plurality of processor elements 102a to 102c provided with redundancy in advance in order to implement various functions.

The configuration of the plurality of processor elements 102 in the reconfigurable circuit module 101 in FIG. 1 is fixed. For example, the reconfigurable circuit module 101 may be incapable of performing an operation using the 14 first processor elements 102a.

Figure 2:
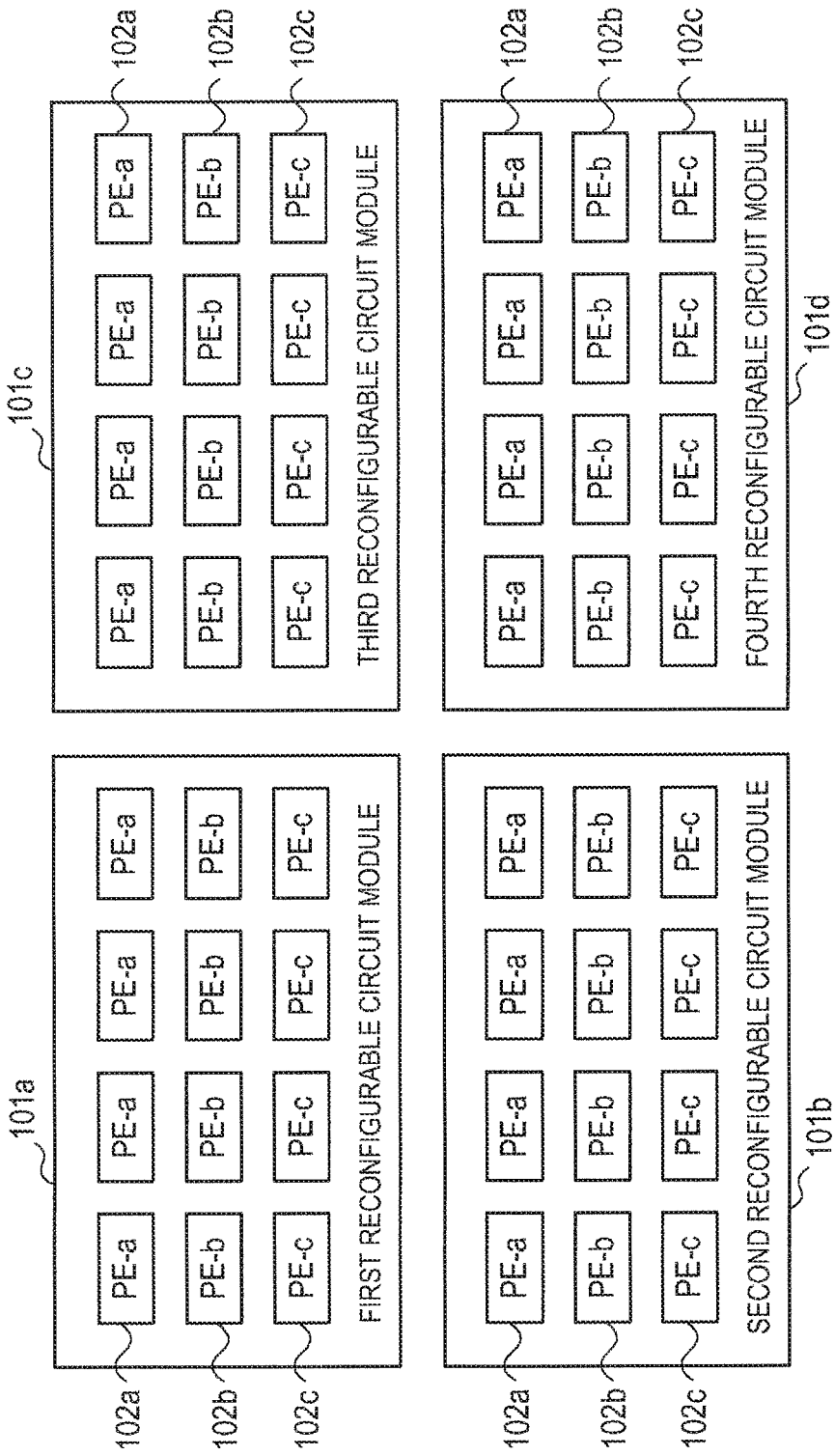
FIG. 2 is a diagram illustrating an example of the configurations of four reconfigurable circuit modules according to an aspect of the Applicant's invention.

FIG. 2 is a diagram illustrating an example of the configurations of four reconfigurable circuit modules according to this aspect of the Applicant's invention. A reconfigurable circuit includes first to fourth reconfigurable circuit modules 101a, 101b, 101c, and 101d in order to use, for example, the 14 first processor elements 102a. The four reconfigurable circuit modules 101a to 101d each have the same configuration as that of the reconfigurable circuit module 101 in FIG. 1. In this case, the configurations of the reconfigurable circuit modules 101a to 101d are fixed. Accordingly, the usage efficiency of the processor elements 102 decreases, and the circuit size increases unnecessarily.

Figure 3:
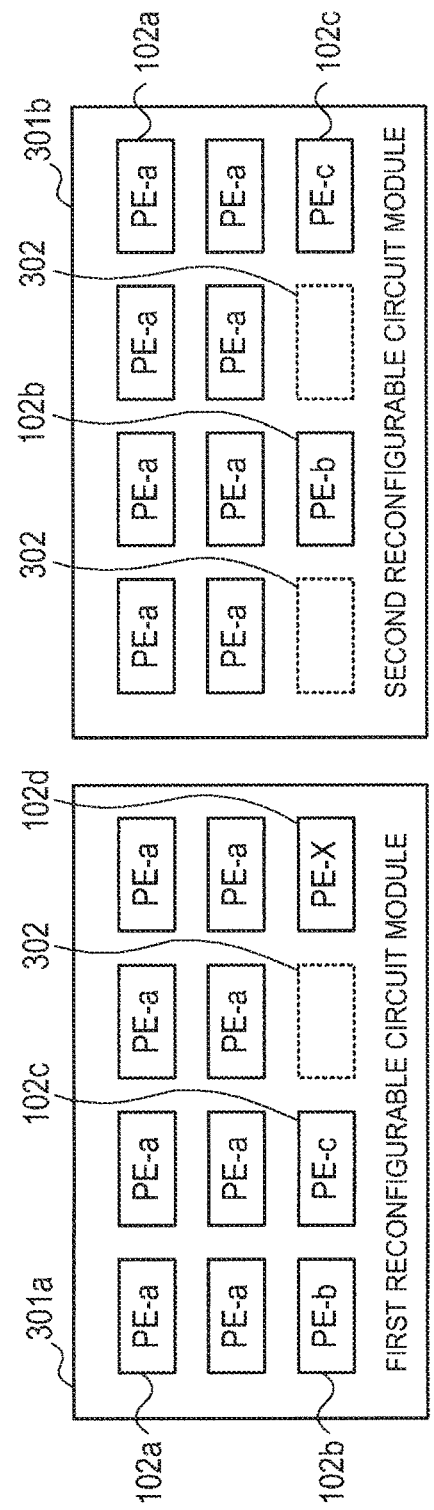
FIG. 3 is a diagram illustrating an example of the configuration of a reconfigurable circuit according to an aspect of the Applicant's invention which can be customized.

FIG. 3 is a diagram illustrating an example of the configuration of a reconfigurable circuit according to this aspect of the Applicant's invention which can be customized. The reconfigurable circuit has modules 301a and 301b. The first reconfigurable circuit module 301a has the eight first processor elements 102a, the one second processor element 102b, the one third processor element 102c, one fourth processor element 102d, and one space area 302. The second reconfigurable circuit module 301b has the eight first processor elements 102a, the one second processor element 102b, the one third processor element 102c, and the two space areas 302.

The reconfigurable circuit modules 301a and 301b are each obtained by customizing the reconfigurable circuit module 101 with the default configuration in FIG. 1. That is, the reconfigurable circuit modules 301a and 301b in FIG. 3 are each generated by, e.g., replacing the specific processor element 102 in the reconfigurable circuit module 101 in FIG. 1. The reconfigurable circuit modules 301a and 301b have configurations different from each other.

Since the reconfigurable circuit in FIG. 3 has the 16 first processor elements 102a, it is capable of performing an operation which requires the 14 first processor elements 102a. The reconfigurable circuit in FIG. 3 is smaller in the number of unnecessary processor elements 102b and 102c than the reconfigurable circuit in FIG. 2. This increases the usage efficiency of the processor elements 102 and makes it possible to reduce the circuit scale.

An example of the configuration of a reconfigurable circuit with a hierarchical structure for implementing the above-described reconfigurable circuits will be described with reference to FIGS. 4 to 7.

Figure 4:
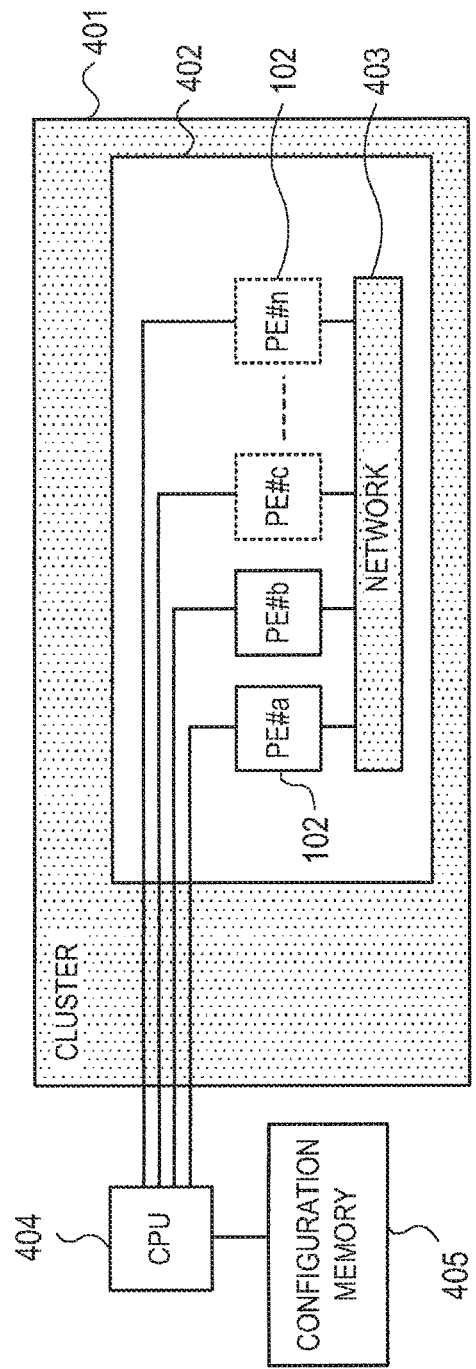
FIG. 4 is a diagram illustrating an example of the configuration of a cluster.

FIG. 4 is a diagram illustrating an example of the configuration of a cluster 401. The cluster 401 has a group 402 of processor elements. The group 402 of processor elements has the plurality of processor elements 102. A network 403 has a both a data network and a control signal network. The network 403 is connected among the inputs and outputs of the plurality of processor elements 102 and selectively connects the inputs and outputs of the plurality of processor elements 102. A CPU 404 reads out configuration data from a configuration memory 405 and outputs n-bit configuration data to each processor element 102. Each processor element 102 is set to have a function corresponding to the configuration data. For example, the processor element 102 functions as an adder, a subtractor, or the like depending on the configuration data. The cluster 401 is a unit of the plurality of processor elements 102.

Figure 5:
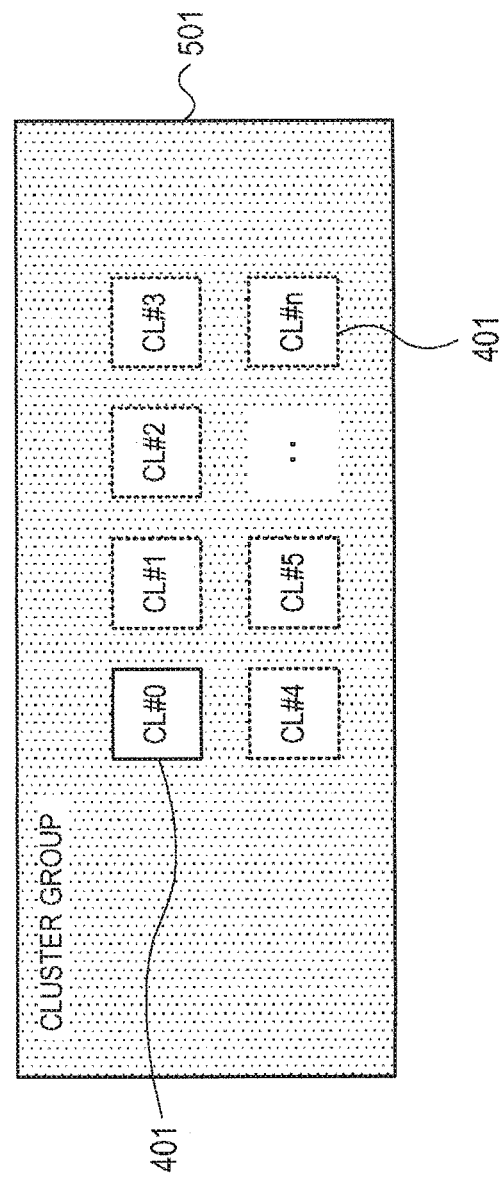
FIG. 5 is a diagram illustrating an example of the configuration of a cluster group.

FIG. 5 is a diagram illustrating an example of the configuration of a cluster group 501. The cluster group 501 has the plurality of clusters 401 in FIG. 4. The cluster group 501 is a unit of the plurality of clusters 401.

Figure 6:
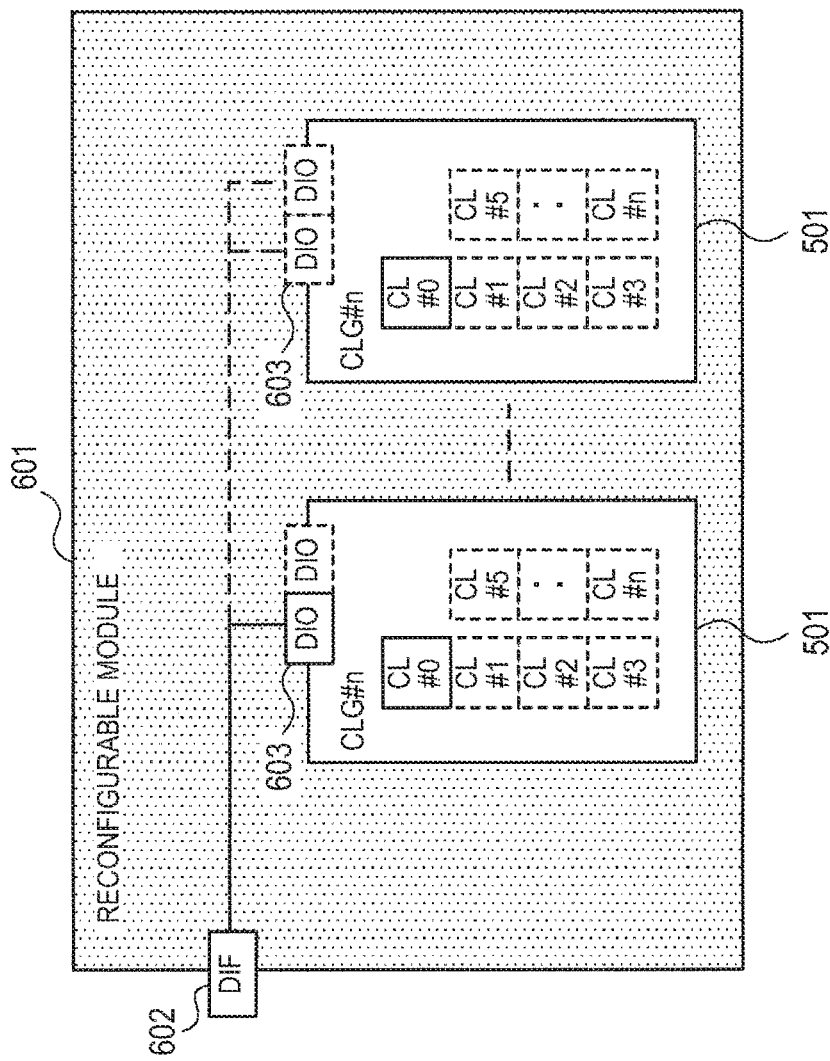
FIG. 6 is a diagram illustrating an example of the configuration of a reconfigurable circuit module.

FIG. 6 is a diagram illustrating an example of the configuration of a reconfigurable circuit module 601. The reconfigurable circuit module 601 has the plurality of cluster groups 501 in FIG. 5 and an I/O port 602. Each cluster group 501 has a plurality of I/O ports 603. The I/O port 603 is an n-bit signal. The I/O port 602 is a port as an interface with the outside and is connected to the I/O ports 603 of the plurality of cluster groups 501. The I/O port 602 is capable of inputting or outputting data from or to the network 403 in FIG. 4 and inputting configuration data from the CPU 404.

Figure 7:
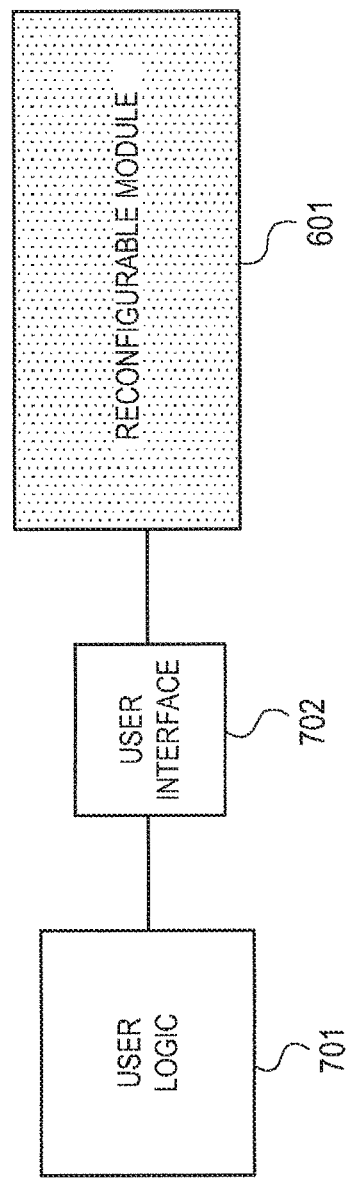
FIG. 7 is a diagram illustrating an example of the configuration of the reconfigurable circuit module, a user logic circuit, and a user interface circuit.

FIG. 7 is a diagram illustrating an example of the configuration of the reconfigurable circuit module 601, a user logic circuit 701, and a user interface circuit 702. The user logic circuit 701 is connected to the reconfigurable circuit module 601 through the user interface circuit 702. The user interface circuit 702 is, e.g., a buffer circuit and is connected between the user logic circuit 701 and the reconfigurable circuit module 601. The user logic circuit 701 can be, for example, a CPU.

Figure 8:
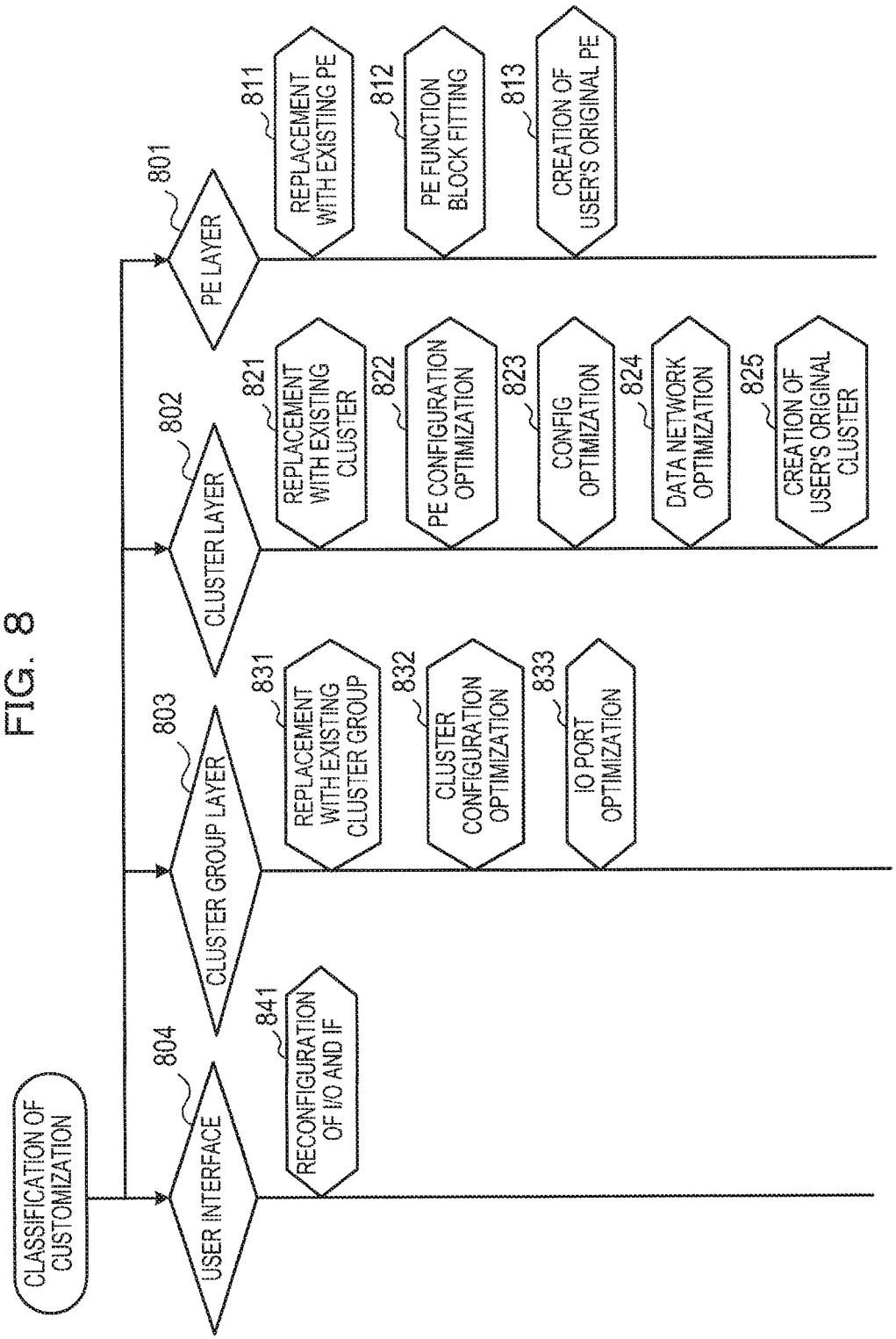
FIG. 8 is a chart illustrating classification of customization for a reconfigurable circuit.

FIG. 8 is a chart illustrating classification of customization for a reconfigurable circuit. First, processor element layer classification (step) 801 includes classification (steps) 811 to 813. The classification 811 includes replacing the processor element 102 in a reconfigurable circuit with a default configuration with the different existing processor element 102. The existing processor element 102 is an pre-existing designed processor element. The classification 812 includes function block fitting of a processor element and will be described with reference to FIG. 9.

Figure 9:
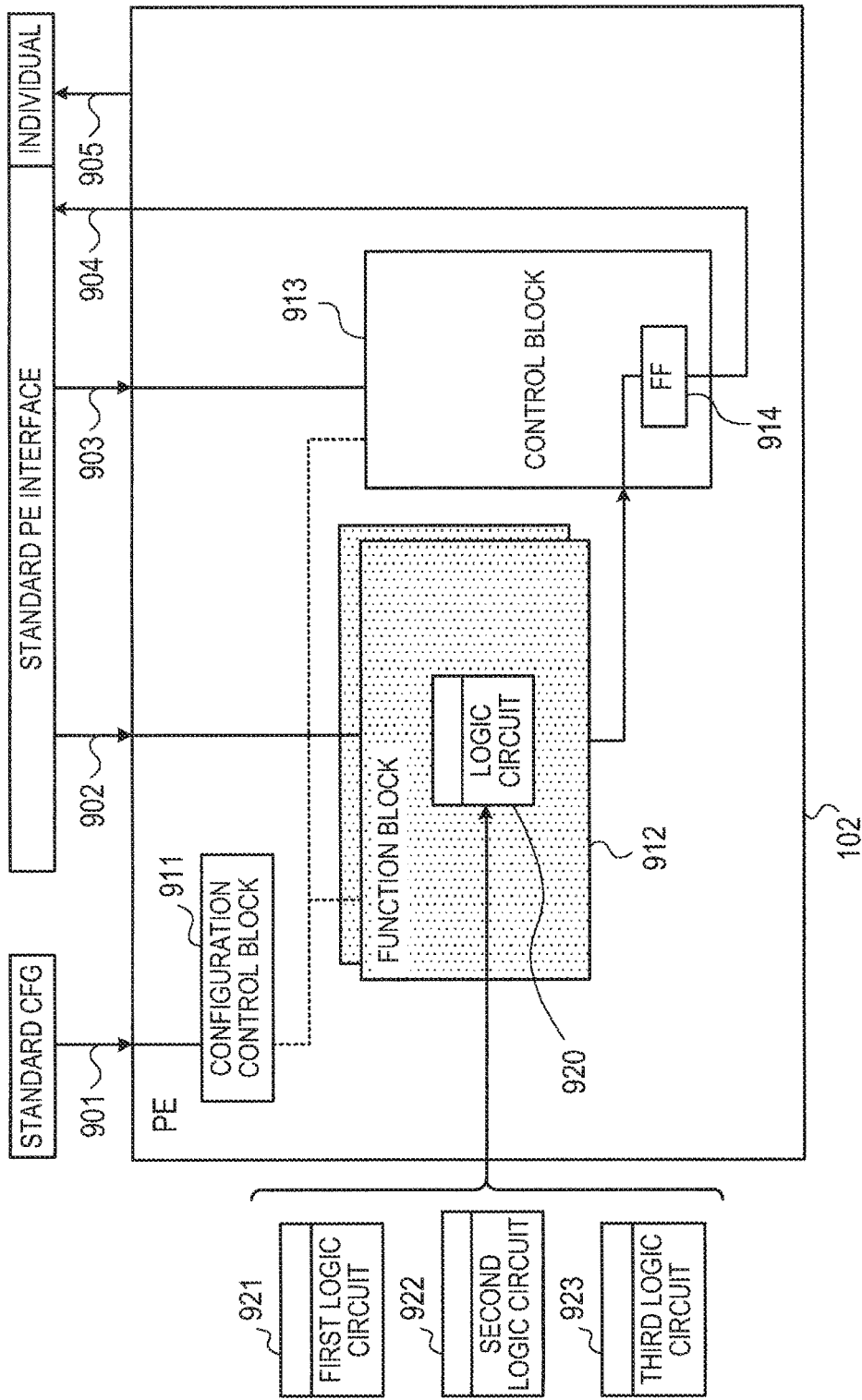
FIG. 9 is a diagram for explaining classification of function block fitting of a processor element.

FIG. 9 is a diagram for explaining the classification 812 of function block fitting of a processor element. The processor element 102 has a configuration control block 911, a function block 912, and a control block 913. The configuration control block 911 decodes configuration data 901 and outputs the decoded configuration data 901 to the function block 912 and control block 913. The function block 912 and control block 913 each have a function corresponding to the configuration data. The function block 912 has a logic circuit 920. The function block 912 inputs input data 902 from the network 403 (FIG. 4) and outputs output data to the control block 913. The control block 913 has a flip-flop 914. The control block 913 inputs an input control signal 903 from the network 403 and outputs output data 904 to the network 403. The flip-flop 914 inputs the output data from the function block 912 and outputs the output data 904. The function block 912 has the logic circuit 920 without a flip-flop. The processor element 102 outputs an individual output signal 905 to the network 403.

As an example of customization, the default logic circuit 920 in the function block 912 may be replaced with a first logic circuit 921, a second logic circuit 922, or a third logic circuit 923.

The classification 813 in FIG. 8 includes creating a user's original processor element and replacing a processor element in a reconfigurable circuit with a default configuration with the user's original processor element.

Cluster layer classification (step) 802 includes classification (steps) 821 to 825. The classification 821 includes replacing a cluster in a default configuration with another existing cluster.

The classification 822 includes creating a cluster by combining a plurality of processor elements and replacing a cluster in a default configuration with the created cluster.

The classification 823 includes removing a configuration data line connected to the space area 302 (FIG. 3), from which the configuration of an unnecessary processor element has been removed.

The classification 824 includes removing the network 403 (FIG. 4) connected to the space area 302 (FIG. 3), from which a network of an unnecessary processor element has been removed.

The classification 825 includes creating a user's original cluster and replacing a cluster in a reconfigurable circuit with a default configuration with the user's original cluster.

Cluster group layer classification (step) 803 includes classification (steps) 831 to 833. The classification 831 includes replacing a cluster group in a default configuration with another existing cluster group.

The classification 832 includes creating a cluster group by combining a plurality of clusters and replacing a cluster group in a default configuration with the created cluster group.

The classification 833 includes setting the number of I/O ports 603 (FIG. 6) of a cluster group.

User interface classification (step) 804 includes classification (step) 841. The classification 841 includes selecting the user interface circuit 702 (FIG. 7) and making settings.

Figure 10:
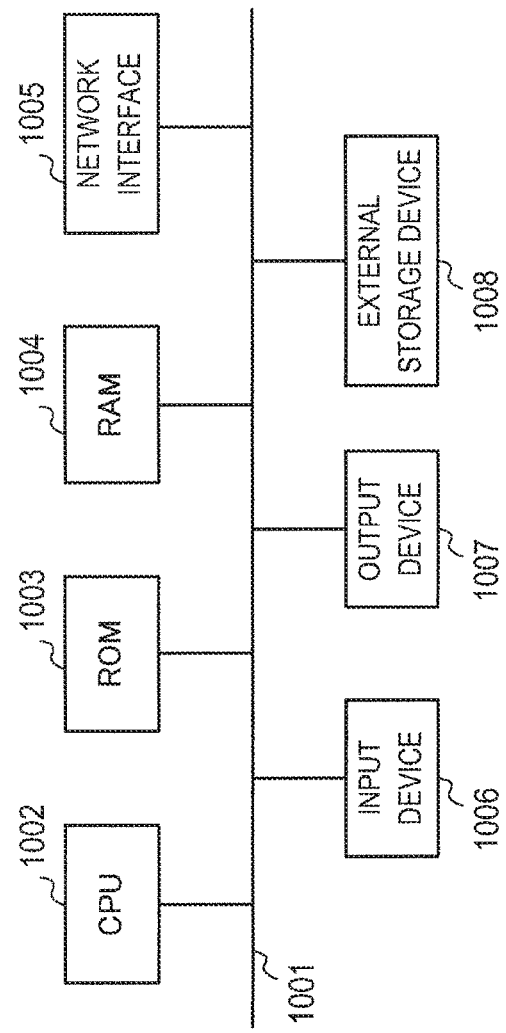
FIG. 10 is a block diagram illustrating an example of the hardware configuration of a computer which constitutes a design apparatus for designing the reconfigurable circuit.

FIG. 10 is a block diagram illustrating an example of the hardware configuration of a computer which constitutes a design apparatus for designing the above-described reconfigurable circuits. The computer is capable of generating the design data of a reconfigurable circuit by CAD (computer-aided design).

A central processing unit (CPU) 1002, a ROM 1003, a RAM 1004, a network interface 1005, an input device 1006, an output device 1007, and an external storage device 1008 are connected to a bus 1001.

The CPU 1002 performs data processing and operations and controls the above-described component units connected through the bus 1001. A boot program is stored in advance in the ROM 1003. The CPU 1002 executes the boot program, thereby booting the computer. A computer program is stored in the external storage device 1008. The computer program is copied to the RAM 1004 and is executed by the CPU 1002. The computer is capable of performing design processing and the similar or related functions in FIGS. 11 to 14 to be described later by executing a computer program.

The external storage device 1008 is, e.g., a hard disk storage device and retains the contents of its memory when the power is cut. The external storage device 1008 is capable of recording a computer program, design data, and the like on a recording medium and reading out a computer program or the like from a recording medium.

The network interface 1005 is capable of inputting or outputting a computer program, design data, and the like from or to a network. The input device 1006 includes, e.g., a keyboard and a pointing device (mouse) and is capable of performing various specification and input operations, and the like. The output device 1007 includes a display, a printer, and the like and is capable of performing display and printing.

This aspect of the Applicant's invention can be implemented by a computer executing a program. Also, means for supplying a program to a computer, e.g., a computer-readable recording medium, such as a CD-ROM, having the program recorded thereon or a transmission medium, such as the Internet, which transmits the program can be used as an aspect of the Applicant's invention of the present invention. Additionally, a computer program product, such as a computer-readable recording medium, having recorded the above-described program can be used as an aspect of the Applicant's invention of the present invention. The program, recording medium, transmission medium, and computer program product described above are included in the scope of the present invention. As the recording medium, for example, for example, a flexible disk, a hard disk, an optical disk, a magnet-optical disk, a CD-ROM, a magnetic tape, a nonvolatile memory card, a ROM, or the like can be used.

FIG. 11 is a flow chart illustrating a processing example of a method for designing a reconfigurable circuit using the reconfigurable circuit design apparatus in FIG. 10. In step 1101, a user generates a source program (in, e.g., the C language) for implementing a function of a reconfigurable circuit to be designed using the design apparatus, and the CPU 1002 stores the source program in the external storage device 1008. In step 1102, the CPU 1002 compiles the source program in the external storage device 1008. With the compilation, a result of determination as to whether the function can be implemented by a reconfigurable circuit with a default configuration is outputted. If the outputted result indicates that the function is implementable, the CPU 1002 generates the design data of the reconfigurable circuit with the default configuration and records the design data in the external storage device 1008. On the other hand, if the outputted result indicates that the function is un-implementable, the flow advances to step 1104. Note that the details of step 1103 will be described later with reference to FIG. 12.

In step 1104, the CPU 1002 outputs a configuration report 1105 as a compilation result and record the configuration report 1105 in the external storage device 1008. The configuration report 1105 includes information on the types of processor elements required to implement the function of the source program and the number of each type of processor elements. After that, the CPU 1002 performs customization in step 1106.

Step 1106 includes steps 1107 to 1110. First, in step 1107, the CPU 1002 performs processor element layer customization on the reconfigurable circuit with the default configuration. If any processor element is customized, the CPU 1002 outputs a definition file 1111 indicating the configuration of a customized processor element and record the definition file 1111 in the external storage device 1008. Step 1107 is a process corresponding to the classification 811 to 813 in FIG. 8.

In step 1108, the CPU 1002 performs cluster layer customization on the reconfigurable circuit. If any cluster is customized, the CPU 1002 outputs a definition file 1112 indicating the configuration of a customized cluster and record the definition file 1112 in the external storage device 1008. Step 1108 is a process corresponding to the classification 821 to 825 in FIG. 8.

In step 1109, the CPU 1002 performs cluster group layer customization on the reconfigurable circuit. If any cluster group is customized, the CPU 1002 outputs a definition file 1113 indicating the configuration of a customized cluster group and record the definition file 1113 in the external storage device 1008. Step 1109 is a process corresponding to the classification 831 to 833 in FIG. 8.

In step 1110, the CPU 1002 performs user interface customization on the reconfigurable circuit. Step 1110 is a process corresponding to the classification 841 in FIG. 8.

When the above-described customization processes terminate, the flow returns to step 1102. The CPU 1002 compiles the source program in order to verify whether the function of the source program is implementable using the customized reconfigurable circuit. With the compilation, a result of the verification as to whether the function can be implemented by the customized reconfigurable circuit is outputted. If the outputted result indicates that the function is implementable, the CPU 1002 generates the design data of the customized reconfigurable circuit and records the design data in the external storage device 1008. On the other hand, if the outputted result indicates that the function is cannot be implemented, the flow advances to step 1104 to perform the customization processes again.

FIG. 12 is a flow chart illustrating the details of the compilation in step 1102 of FIG. 11. Source programs 1201 and 1203 are each a program describing processing of the user CPU 701 (FIG. 7), and a source program 1202 is a program describing processing of a reconfigurable circuit (including the module 601 and user interface 702 in FIG. 7). The source programs 1201 to 1203 can be written in a number of programming languages including, for example, the C programming language.

In step 1204, the CPU 1002 logically compiles the source program (function) 1202 for the reconfigurable circuit and visualizes a data processing flow. At the time of the logical compilation, in step 1205, the CPU 1002 performs performance evaluation, including scale and area estimation, for the data processing flow. Subsequently, in step 1209, the CPU 1002 outputs a configuration report. Step 1209 corresponds to step 1104 in FIG. 11.

In step 1206, after the logical compilation, the CPU 1002 physically compiles the source program 1202 for the reconfigurable circuit and maps processes (functions) to processor elements. At the time of the physical compilation, in step 1207, the CPU 1002 determines a data processing flow, a processor element configuration, and the like and performs mapping to the processor elements. Subsequently, in step 1208, the CPU 1002 outputs a configuration report. Step 1208 corresponds to step 1104 in FIG. 11.

In step 1210, after the physical compilation, the CPU 1002 generates configuration data 1211 and records the configuration data 1211 in the external storage device 1008.

Figure 13A:
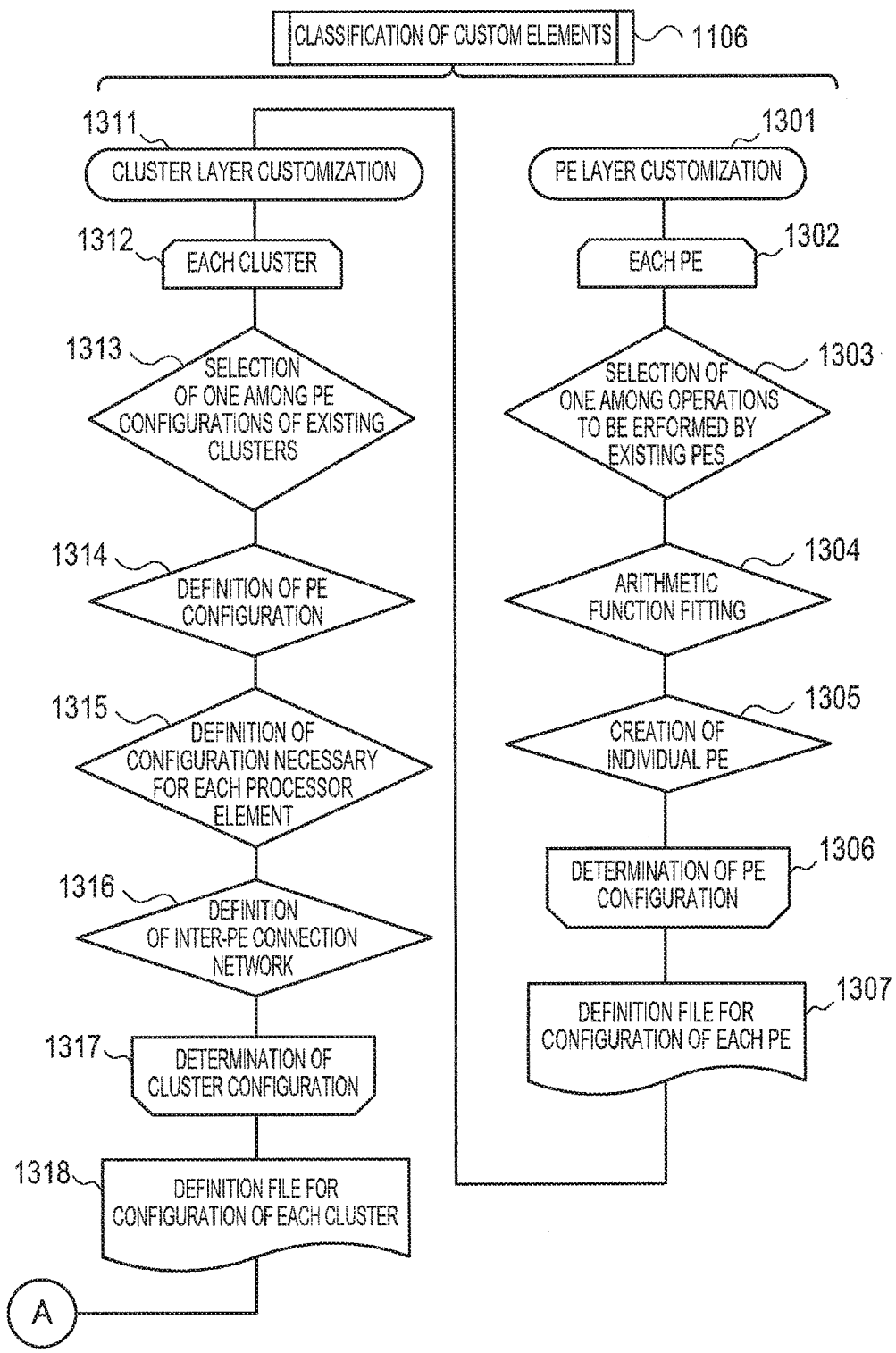
FIGS. 13A and 13B are flow charts illustrating the details of customization in FIG. 11.
Figure 13B:
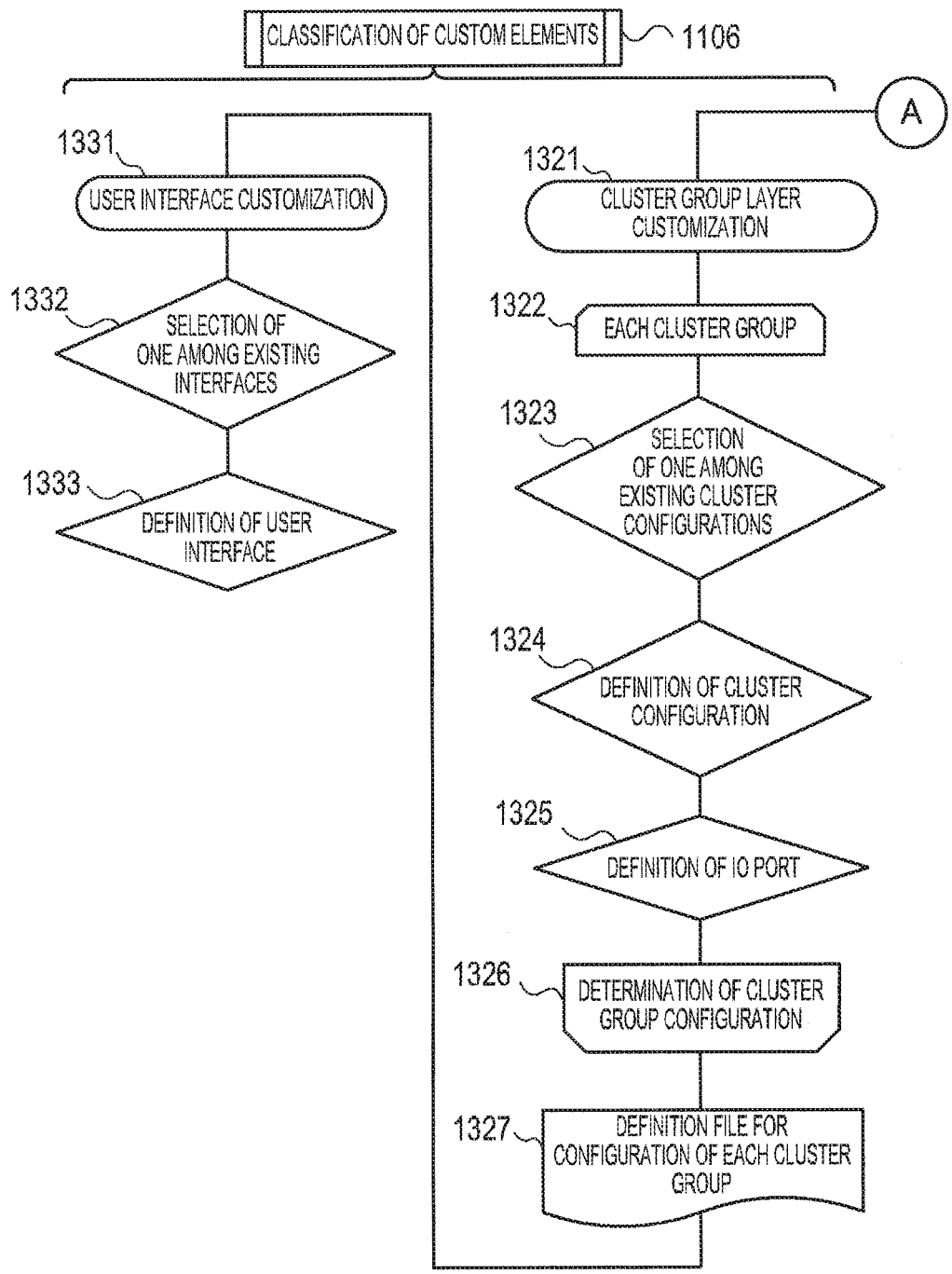

FIGS. 13A and 13B are flow charts illustrating the details of the customization in step 1106 of FIG. 11. Processor element layer customization in step 1301 corresponds to step 1107 in FIG. 11, cluster layer customization in step 1311 corresponds to step 1108 in FIG. 11, cluster group layer customization in step 1321 corresponds to step 1109 in FIG. 11, and user interface customization in step 1331 corresponds to step 1110 in FIG. 11.

First, in step 1301, the CPU 1002 performs processor element layer customization. In step 1301, the CPU 1002 performs a loop process, starting at step 1302 and ending at step 1307. Step 1302 is the beginning of the loop process. In step 1302, the CPU 1002 extracts necessary processor elements on the basis of the configuration report 1105 as a compilation result and starts customization of processor elements.

In step 1303, the CPU 1002 selects one among arithmetic operations to be performed by existing processor elements. More specifically, the CPU 1002 selects a necessary one among the processor elements with basic arithmetic functions including an addition function, a subtraction function, a multiplication function, a shift function, a selector function, a register function, and a memory function and replaces a processor element in a default configuration with the selected processor element.

In step 1304, the CPU 1002 performs arithmetic function fitting. More specifically, if the existing processor elements do not have a necessary arithmetic function, the CPU 1002 defines an operator for the function block 912 (FIG. 9) of a processor element, determines a library arithmetic function and a symbol of operation, and implements the arithmetic function for the processor element while maintaining the external interface of the processor element. The CPU 1002 then replaces the processor element in the default configuration with the processor element.

In step 1305, the CPU 1002 creates an individual processor element. More specifically, if a target processor element is a processor element which is not implemented by the existing processor elements and is not supported by the arithmetic function fitting, the CPU 1002 newly designs a processor element, incorporates the processor element as an existing processor element, and replaces the processor element in the default configuration with the processor element.

In step 1306, the CPU 1002 repeats a loop process, such as steps 1303 to 1305 described above, for each of the necessary processor elements. When the repetition of the loop process ends, the CPU 1002 generates a definition file 1307 for the configuration of each of the necessary processor elements.

In step 1311, the CPU 1002 performs cluster layer customization. In step 1311, the CPU 1002 performs a loop process, starting at step 1312 and ending at step 1317. Step 1312 is the beginning of the loop process. In step 1312, the CPU 1002 extracts necessary clusters on the basis of the configuration report 1105 as the compilation result and, optionally, a data flow and starts customization of clusters.

In step 1313, the CPU 1002 selects one among processor element configurations of existing clusters. More specifically, the CPU 1002 assigns a required number of processor elements to a cluster, obtains the types of the necessary processor elements and the number of each type of necessary processor elements, and selects the existing cluster with the selected processor element configuration. The CPU 1002 replaces a cluster in a default configuration with the selected cluster.

In step 1314, the CPU 1002 defines a processor element configuration. More specifically, if a target cluster is not one of the existing clusters, the CPU 1002 determines the types of processor elements to be arranged in a cluster and the number of each type of processor elements and defines a processor element configuration. The CPU 1002 replaces the cluster in the default configuration with the cluster.

In step 1315, the CPU 1002 defines a configuration necessary for each processor element. More specifically, the CPU 1002 optimizes a configuration necessary for each selected processor element. The CPU 1002 checks instructions to be used by each processor element, extracts an unnecessary one of the instructions, and removes the configuration data line of the unnecessary instruction.

In step 1316, the CPU 1002 defines an inter-processor-element connection network. More specifically, after the determination of the processor element configuration, the CPU 1002 checks a necessary inter-processor-element connection and judges whether each inter-processor-element network 403 (FIG. 4) is unnecessary or necessary. If a different type of networking connectivity is necessary, redundancy is provided. The CPU 1002 removes the unnecessary inter-processor-element network 403, if any.

In step 1317, the CPU 1002 repeats a loop process, such as the four steps 1313 to 1316 described above, for each of the necessary clusters. When the repetition of the loop process ends, the CPU 1002 generates a definition file 1318 for the configuration of each of the necessary clusters.

In step 1321, the CPU 1002 performs cluster group layer customization. In step 1321, the CPU 1002 performs a loop process, starting at step 1322 and ending at step 1326. Step 1322 is the beginning of the loop process. In step 1322, the CPU 1002 extracts necessary cluster groups on the basis of the configuration report 1105 as the compilation result and starts customization of cluster groups.

In step 1323, the CPU 1002 selects one among exiting cluster configurations. More specifically, after the CPU 1002 checks a necessary cluster configuration and the number of clusters, it selects one of the existing cluster configurations which are the same as the necessary cluster configuration. The CPU 1002 replaces a cluster group in a default configuration with the selected cluster group.

In step 1324, the CPU 1002 defines a cluster configuration. More specifically, if a target cluster group is not one of the existing cluster groups, the CPU 1002 distributes clusters and defines groups of clusters (constituting cluster groups) and the number of groups. The CPU 1002 replaces the cluster group in the default configuration with the defined cluster groups.

In step 1325, the CPU 1002 defines an external I/O port. More specifically, if connection between cluster groups and direct input of data without a user interface are desired, the CPU 1002 calculates the number of I/O ports for necessary data and then defines the number of I/O ports.

In step 1326, the CPU 1002 repeats a loop process, the three steps 1323 to 1325 described above, for each of the necessary cluster groups. When the repetition of the loop process terminates, the CPU 1002 generates a definition file 1327 for the configuration of each of the necessary cluster groups.

In step 1331, the CPU 1002 performs user interface customization. In step 1331, the CPU 1002 performs processes in steps 1332 and 1333. More specifically, the CPU 1002 performs customization to interface with a system to be incorporated. Since a module to be customized is limited to an interface module, connectivity can be provided with flexibility.

In step 1332, the CPU 1002 selects one among existing interface modules. More specifically, the CPU 1002 checks a connection interface with an external module, assign a general-purpose interface module, performs construction, and incorporates a reconfigurable circuit module into a user circuit.

In step 1333, the CPU 1002 defines a user interface. More specifically, if an individual user interface is necessary, the CPU 1002 specifies a user interface and designs an interface module. After the design, the CPU 1002 assigns the interface module as a user interface module, performs construction, and incorporates a reconfigurable circuit module into the user circuit.

The interface module (circuit) 702 customized in the above-described manner is arranged between the reconfigurable circuit module 601 and the user circuit module 701 to interface between them.

Figure 14:
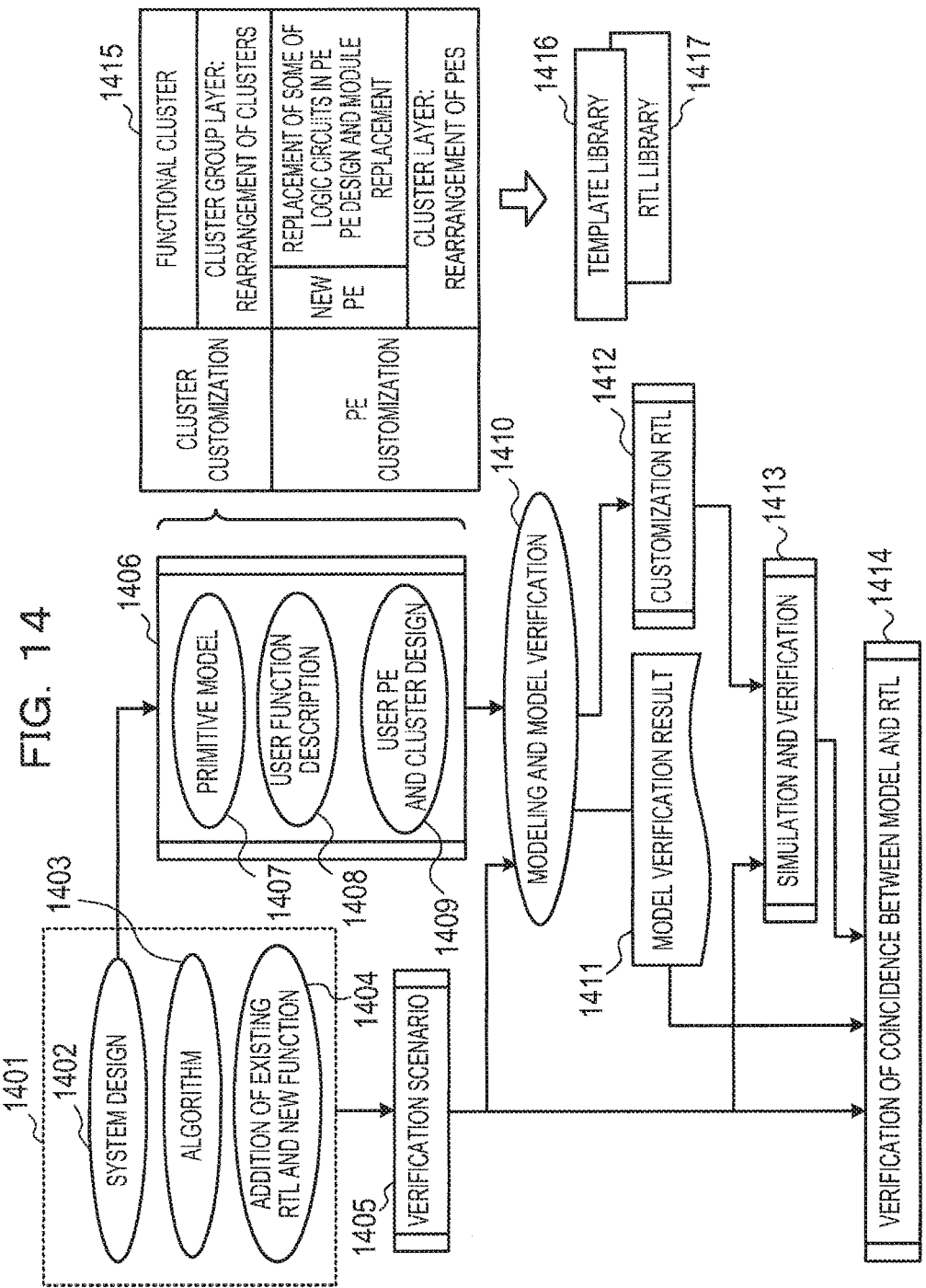
FIG. 14 is a flow chart illustrating a processing example of a method for designing a reconfigurable circuit using a design apparatus according to an aspect of the Applicant's invention.

FIG. 14 is a flow chart illustrating a processing example of a method for designing a reconfigurable circuit using a reconfigurable circuit design apparatus according to this aspect of the Applicant's invention. In step 1401, the CPU 1002 performs compilation of a source program corresponding to step 1102 in FIG. 11 in order to fulfill requests from a program tool 1402 for system design, a program tool 1403 for algorithm implementation, and a program tool 1404 for addition of existing RTL (register transfer level) design data and a new function. After that, the flow advances to steps 1405 and 1406.

In step 1406, after the compilation, the CPU 1002 performs design processing of a reconfiguration circuit. Step 1406 includes steps 1407 to 1409 and 1415.

In step 1407, the CPU 1002 performs design processing of primitive models such as an existing IP and an existing processor element by a primitive model program tool. In step 1408, the CPU 1002 designs a user function block description (e.g., a logic circuit without a flip-flop) by a program tool for user function description. In step 1409, the CPU 1002 designs a standard processor element, a user processor element such as an interface, and a cluster by a program tool for user processor element and cluster design.

Step 1415 corresponds to the customization in step 1106 of FIG. 11 and includes cluster customization and processor element customization. The cluster customization includes functional cluster customization and the process of rearranging clusters at a cluster group layer. The processor element customization includes new processor element customization and the process of rearranging processor elements at a cluster layer. The new processor element customization includes replacement of some of logic circuits in a processor element, design of a processor element, and module replacement.

The process in step 1415 causes a template library 1416 and an RTL design data library 1417 to be generated, be recorded in the external storage device 1008, and be compiled into a database.

In step 1405, the CPU 1002 performs generation of a verification scenario. More specifically, the CPU 1002 generates a scenario where if a=1, b=2, and c=3, x=6, in order to verify a function (e.g., x=a+b+c) in the source program (in the C language).

In step 1410, the CPU 1002 inputs the verification scenario in the C language from step 1405 and inputs design data in System C (C++) from step 1406. The CPU 1002 performs modeling on the basis of the design data and verifies a model using the verification scenario. The CPU 1002 then outputs a model verification result 1411.

In step 1412, the CPU 1002 generates customization RTL design data on the basis of the model.

In step 1413, the CPU 1002 performs simulation and verification on the basis of the RTL design data and verification scenario.

In step 1414, the CPU 1002 verifies, on the basis of the verification scenario, the model verification result 1411, and the simulation and verification result in step 1413, whether the model verification result and the result of verifying the RTL design data coincide with each other. If the results coincide, generation of the design data of the reconfigurable circuit is completed.

As described above, according to this aspect of the Applicant's invention, an LSI function of an LSI designed in a language abstracted by programming or the like can be changed only by changing configuration data, in a logic circuit design methodology. It is possible to arrange an execution program generally executed by a CPU or the like in an optimized logic circuit (or map the execution program to a processor element) and, thereby, improve performance. It is also possible to arrange a programmed application in a logic operation circuit, which contributes to an effective reduction in the number of man-hours for design as a logic circuit methodology. Customized design assessment makes it possible to unfailingly satisfy needs of a logic circuit which can be implemented by rewriting configuration data.

A reconfigurable circuit design method according to this aspect of the Applicant's invention includes an input step of inputting design data of a default configuration of a reconfigurable circuit including a plurality of processor elements 102 which perform processing and a first generation step 801 of generating design data obtained by modifying at least one of the processor elements 102 in the reconfigurable circuit with the default configuration.

The first generation step 801 includes the step 811 of generating design data obtained by replacing at least one of the processor elements 102 in the reconfigurable circuit with another processor element 102.

The second generation step 802 includes regarding a unit of the plurality of processor elements 102 in the reconfigurable circuit as a cluster 401 and generating design data obtained by performing modification in units of a plurality of the clusters 401 in the reconfigurable circuit.

The second generation step 802 includes the step 821 of generating design data obtained by replacing at least one of the clusters 401 in the reconfigurable circuit with another cluster 401.

The third generation step 803 includes regarding a unit of the plurality of clusters 401 in the reconfigurable circuit as a cluster group 501 and generating design data obtained by performing modification in units of a plurality of the cluster groups 501 in the reconfigurable circuit.

The third step 803 includes the step 831 of generating design data obtained by replacing at least one of the cluster groups 501 in the reconfigurable circuit with another cluster group 501.

The fourth generation step 804 includes design data obtained by modifying an interface circuit 702 of the reconfigurable circuit.

A reconfigurable circuit design apparatus according to this aspect of the Applicant's invention includes an input section which inputs design data of a default configuration of a reconfigurable circuit including a plurality of processor elements 102 which perform processing and a first generation section which generates design data obtained by modifying at least one of the processor elements in the reconfigurable circuit with the default configuration.

A reconfigurable circuit according to this aspect of the Applicant's invention regards a unit of a plurality of processor elements 102 which perform processing as a cluster 401 and includes a plurality of the clusters 401. Additionally, the reconfigurable circuit regards a unit of the plurality of clusters 401 as a cluster group 501 and includes a plurality of the cluster groups 501.

According to this aspect of the Applicant's invention, the flexibility of the configuration of a reconfigurable circuit increases, and various functions can be implemented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the aspect of the Applicant's invention(s) of the present inventions have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A reconfigurable circuit design method, comprising:
   determining, via a processor, design data representing a default configuration of a reconfigurable circuit based on a compilation result of user input data, wherein the design data includes information of a plurality of processor elements; and
   generating first design data by determining and selecting one or more processor elements of the reconfigurable circuit based on one or more arithmetic operations defined in the compilation result, and replacing at least one of the plurality of processor elements in the default configuration with the determined and selected one or more processor elements.

2. The reconfigurable circuit design method according to claim 1, further comprising
   clustering a unit of the plurality of processor elements in the reconfigurable circuit and generating second design data by modifying units of a plurality of the clusters in the reconfigurable circuit.

3. The reconfigurable circuit design method according to claim 2, further comprising generating the second design data by replacing at least one of the clusters in the reconfigurable circuit with another cluster.

4. The reconfigurable circuit design method according to claim 2, further comprising
   grouping the plurality of clusters in the reconfigurable circuit and generating third design data by modifying the cluster groups.

5. The reconfigurable circuit design method according to claim 4, further comprising generating the third design data by replacing at least one of the cluster groups in the reconfigurable circuit with another cluster group.

6. The reconfigurable circuit design method according to claim 4, further comprising
   generating fourth design data by modifying an interface circuit of the reconfigurable circuit.

7. The reconfigurable circuit design method according to claim 1, wherein the determining and selecting one or more processor elements comprises designing at least one processing element based on the one or more arithmetic operations upon determining that existing processing elements of the reconfigurable circuit fail to implement the one or more arithmetic operations.

8. The reconfigurable circuit design method according to claim 1, further comprising removing a configuration data line and a network both connected to a space area of the reconfigurable circuit in response to a removal of an unnecessary processor element in the default configuration.

9. The reconfigurable circuit design method according to claim 1, wherein the compilation result is obtained via a logical compilation of the user input data based on circuit scale and area estimation, and a physical compilation to map processes to the plurality of the plurality of processor elements.

10. A reconfigurable circuit design apparatus, comprising:
    a processor coupled to a memory, configured to:
    receive and determine design data of a default configuration of a reconfigurable circuit based on a compilation result of user input data, wherein the design data includes information of a plurality of processor elements; and
    generate first design data by determining and selecting one or more processor elements of the reconfigurable circuit based on one or more arithmetic operations defined in the compilation result, and replacing at least one of the plurality of processor elements in the default configuration with the determined and selected one or more processor elements.

* * * * *